US012785625B2

(12) United States Patent
Lee et al.

(10) Patent No.: US 12,785,625 B2
(45) Date of Patent: *Nov. 3, 2026

(54) BUFFER CIRCUIT HAVING ENHANCED SLEW RATE

(71) Applicant: MagnaChip Semiconductor, Ltd., Cheongju-si (KR)

(72) Inventors: Myungwoo Lee, Seongnam-si (KR); Hyungseok Kim, Suwon-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 491 days.

This patent is subject to a terminal disclaimer.

(21) Appl. No.: 18/468,909

(22) Filed: Sep. 18, 2023

(65) Prior Publication Data

US 2024/0313705 A1 Sep. 19, 2024

(30) Foreign Application Priority Data

Mar. 13, 2023 (KR) ........................ 10-2023-0032772

(51) Int. Cl.
*H03F 1/02* (2006.01)
*H03F 3/45* (2006.01)

(52) U.S. Cl.
CPC ....... *H03F 1/0216* (2013.01); *H03F 3/45183* (2013.01); *H03F 3/45273* (2013.01); *H03F 2203/45674* (2013.01)

(58) Field of Classification Search
CPC ............... H03F 1/0216; H03F 3/45183; H03F 3/45273; H03F 3/45121; H03F 2203/45674; H03F 2203/45248; G09G 3/20; G09G 2310/027; G09G 2310/0291; G09G 2310/0297; G09G 2320/0252; G09G 2330/021; H03K 19/00315; H03K 19/018507; H03K 19/00361
USPC ................................. 330/253, 255, 257, 127
See application file for complete search history.

(56) References Cited

U.S. PATENT DOCUMENTS 9,543,912 B2 1/2017 Lee
2022/0383823 A1* 12/2022 Lee ...................... G09G 3/3275

* cited by examiner

*Primary Examiner* — Andrea Lindgren Baltzell
*Assistant Examiner* — Nareh Shamiryan
(74) *Attorney, Agent, or Firm* — NSIP Law

(57) ABSTRACT

A buffer circuit for generating an output voltage according to an input voltage includes: an input stage configured to provide a first differential current to a load stage or receive a second differential current from the load stage based on a difference between the input voltage and the output voltage; the load stage configured to apply gate voltages to a first output transistor and a second output transistor of an output stage based on the first differential current or the second differential current; the output stage configured to regulate the output voltage based on the gate voltages applied to the first output transistor and the second output transistor; and a slew rate compensator configured to provide a source current to the load stage or receive a sink current from the load stage to regulate the gate voltages of the first output transistor and the second output transistor.

20 Claims, 8 Drawing Sheets

BUFFER CIRCUIT HAVING ENHANCED SLEW RATE

CROSS-REFERENCE TO RELATED APPLICATIONS

The present application claims the benefit under 35 U.S.C. § 119(a) of Korea Patent Application No. 10-2023-0032772, filed on Mar. 13, 2023, in the Korean Intellectual Property Office, the entire disclosure of which is incorporated herein by reference for all purposes.

BACKGROUND

1. Field

The following description relates to a circuit for improving the slew rate of a buffer amplifier, and in particular to a slew rate compensator comprising a source follower.

2. Description of the Related Art

Display driver integrated circuits (DDICs) are widely used in devices such as portable electronic devices (e.g., smart phones, tablet personal computers (PCs)) and vehicle displays (digital instrument panels, navigation devices, etc.). The DDIC includes an output buffer circuit that outputs data as a source drive circuit for driving a panel such as an LCD or OLED device and the like. For these DDICs, there is an increasing demand for performance improvement in terms of high resolution, display quality, low power consumption, and the like.

A buffer amplifier of the source drive circuit of the DDIC exists independently for respective R/G/B representing pixels, or only one buffer amplifier exists for R/G/B pixels, but in that case it is possible for each of the R/G/B pixels to be driven in a time division manner for higher resolution. In time-division driving, the time given to each source drive circuit for data output is reduced, and the slew rate of the buffer amplifier should be improved accordingly. In addition, a large number of source drive circuits and buffer amplifiers are required to satisfy high resolution, which greatly affects the size and power consumption of the entire DDIC.

Accordingly, there is a need for a buffer amplifier circuit that has an improved slew rate, alleviates size constraints, and can be implemented with low power consumption.

SUMMARY

This Summary is provided to introduce a selection of concepts in a simplified form that are further described below in the Detailed Description, This Summary is not intended to identify key features or essential features of the claimed subject matter, not is it intended to be used as an aid in determining the scope of the claimed subject matter.

In one general aspect, a buffer circuit for generating an output voltage according to an input voltage includes: an input stage configured to provide a first differential current to a load stage or receive a second differential current from the load stage based on a difference between the input voltage and the output voltage; the load stage configured to apply gate voltages to a first output transistor and a second output transistor of an output stage based on the first differential current or the second differential current; the output stage configured to regulate the output voltage based on the gate voltages applied to the first output transistor and the second output transistor; and a slew rate compensator configured to provide a source current to the load stage or receive a sink current from the load stage to regulate the gate voltages of the first output transistor and the second output transistor.

The slew rate compensator may include: a first comparator configured to switch to an ON or OFF state based on the difference between the input voltage and the output voltage; a source follower comprising an NMOS transistor and configured to reduce the input voltage by a threshold voltage of the NMOS transistor and provide the reduced input voltage to a gate terminal of a second comparator; the second comparator configured to switch to an ON or OFF state based on a difference between the reduced input voltage and the output voltage; a source current circuit configured to provide the source current to the load stage; and a sink current circuit configured to receive the sink current from the load stage.

The first comparator may include an NMOS transistor having a gate receiving the input voltage, a drain connected to the source current circuit, a source receiving the output voltage, and a body connected to the source, and the second comparator may include a PMOS transistor having a source receiving the output voltage, a gate receiving the reduced input voltage output from the source follower, and a drain connected to the sink current circuit.

The source follower may include the NMOS transistor having a gate receiving the input voltage, a drain connected to a power supply voltage, a source connected to a gate of a PMOS transistor of the second comparator, and a body connected to the source, and the source follower may be configured to reduce the input voltage by the threshold voltage of the NMOS transistor and provide the reduced input voltage to the gate of the PMOS transistor of the second comparator.

The sink current circuit may include: a first sink NMOS transistor connected to the second comparator and configured to allow a sink reference current to flow therein; and a second sink NMOS transistor having a current mirror structure based on the first sink NMOS transistor to mirror the sink reference current and configured to allow the sink current to flow therein.

The first sink NMOS transistor may have a gate connected to the second comparator, a drain connected to the gate, and a source connected to a ground voltage, and the second sink NMOS transistor may have a gate connected to the gate of the first sink NMOS transistor, a drain connected to a second node of the load stage having a mirror structure with a first node of the load stage connected to a gate terminal of the first output transistor, and a source connected to the ground voltage.

The source current circuit may include: a first source PMOS transistor connected to the first comparator and configured to allow a source reference current to flow therein; and a second source PMOS transistor having a current mirror structure based on the first source PMOS transistor to mirror the source reference current and configured to allow the source current to flow therein.

The first source PMOS transistor may have a gate connected to the first comparator, a drain connected to the gate, and a source receiving a power supply voltage, and the second source PMOS transistor may have a gate connected to the gate of the first source PMOS transistor, a drain connected to a fourth node of the load stage having a mirror structure with a third node of the load stage connected to a gate terminal of the second output transistor, and a source receiving the power supply voltage.

The slew rate compensator may further include: a slew rate compensation switch configured to determine whether to operate the source current circuit or the sink current circuit.

The load stage may include: a first differential mirror circuit configured to have a current mirror structure and a cascode structure and mirror the second differential current and the sink current; a second differential mirror circuit configured to have a current mirror structure and a cascode structure and mirror the first differential current and the source current; and a third bias circuit and a fourth bias circuit connected between the first differential mirror circuit and the second differential mirror circuit and configured to control a static state operation and an amplification operation of the first differential mirror circuit and the second differential mirror circuit.

The first differential mirror circuit may include: a first load stage PMOS transistor and a second load stage PMOS transistor configured to perform a current mirroring operation; and a third load stage PMOS transistor and a fourth load stage PMOS transistor connected in series with the first load stage PMOS transistor and the second load stage PMOS transistor to form a cascode structure. The first load stage PMOS transistor may have a gate connected to the third bias circuit in common with the second load stage PMOS transistor, a drain connected to the third load stage PMOS transistor, and a source connected to a power supply voltage, the second load stage PMOS transistor may have a gate connected to the third bias circuit in common with the first load stage PMOS transistor, a drain connected to the fourth load stage PMOS transistor, and a source connected to the power supply voltage, the third load stage PMOS transistor may have a gate connected between the first load stage PMOS transistor and the third bias circuit to receive a third bias voltage, and a drain connected to the gate of the first load stage PMOS transistor and a second node to provide the sink current to the slew rate compensator, and a source connected to the first load stage PMOS transistor, and the fourth load stage PMOS transistor may have a gate connected between the second load stage PMOS transistor and the fourth bias circuit to receive the third bias voltage, a drain connected to a first node which is connected to the fourth bias circuit and a gate terminal of the first output transistor, and a source connected to the second load stage PMOS transistor.

The second differential mirror circuit may include: a first load stage NMOS transistor and a second load stage NMOS transistor configured to perform a current mirroring operation; and a third load stage NMOS transistor and a fourth load stage NMOS transistor connected in series with the first load stage NMOS transistor and the second load stage NMOS transistor to form a cascode structure. The first load stage NMOS transistor may have a gate connected to the third bias circuit in common with the second load stage NMOS transistor, a drain connected to the third load stage NMOS transistor, and a source connected to a ground voltage, the second load stage NMOS transistor may have a gate connected to the third bias circuit in common with the first load stage NMOS transistor, a drain connected to the fourth load stage NMOS transistor, and a source connected to the ground voltage, the third load stage NMOS transistor may have a gate connected between the first load stage NMOS transistor and the third bias circuit to receive a fourth bias voltage, a drain connected to the gate of the first load stage NMOS transistor and a fourth node to receive the source current from the slew rate compensator, and a source connected to the first load stage NMOS transistor, and the fourth load stage NMOS transistor may have a gate connected between the second load stage NMOS transistor and the fourth bias circuit to receive the fourth bias voltage, a drain connected to a third node which is connected to the fourth bias circuit and a gate terminal of the second output transistor, and a source connected to the second load stage NMOS transistor.

The output stage may include: a first compensation capacitor and a second compensation capacitor connected in parallel with an output terminal through which the output voltage is output, and the first output transistor and the second output transistor connected in parallel with the output terminal.

In another general aspect, a buffer circuit for generating an output voltage according to an input voltage may include: an input stage configured to provide a first differential current to a load stage or receive a second differential current from the load stage based on a difference between the input voltage and the output voltage; the load stage configured to apply gate voltages to a first output transistor and a second output transistor of an output stage based on the first differential current or the second differential current; the output stage configured to regulate the output voltage based on the gate voltages applied to the first output transistor and the second output transistor; and a slew rate compensator configured to provide a source current to the load stage or receive a sink current from the load stage to regulate the gate voltages of the first output transistor and the second output transistor, and the slew rate compensator may include: a first comparator, a second comparator connected to the first comparator, and a source follower configured to reduce the input voltage by a threshold voltage of a MOS transistor included in the source follower and provide the reduced input voltage to a gate terminal of the second comparator.

The slew rate compensator may include: a source current circuit configured to provide the source current to the load stage; and a sink current circuit configured to receive the sink current from the load stage.

The first comparator may include an NMOS transistor having a gate receiving the input voltage, a drain connected to the source current circuit, a source receiving the output voltage, and a body connected to the source, and the second comparator may include a PMOS transistor having a gate receiving the reduced input voltage output from the source follower, a drain connected to the sink current circuit, and a source receiving the output voltage.

The source follower may include an NMOS transistor having a gate receiving the input voltage, a drain connected to a power supply voltage, a source connected to the gate of the PMOS transistor of the second comparator, and a body connected to the source, and the source follower may be configured to reduce the input voltage by a threshold voltage of the NMOS transistor and provide the reduced input voltage to the gate of the PMOS transistor of the second comparator.

In another general aspect, a method of controlling a buffer circuit includes: comparing an input voltage and an output voltage of the buffer circuit; providing a source current to a load stage or receiving a sink current from the load stage by a slew rate compensator based on a difference between the input voltage and the output voltage; flowing a first compensation current and a second compensation current through a first differential mirror circuit and a second differential mirror circuit of the load stage based on the source current and the sink current; increasing or decreasing gate voltages of a first output transistor and a second output transistor of an output stage based on the first compensation current and the second compensation current; and allowing the output voltage to follow a rising or falling transition of the input voltage based on an increase or decrease in the gate voltages of the first output transistor and the second output transistor, and the comparing of the input voltage and the output voltage may further include: comparing the difference between the input voltage and the output voltage when the input voltage is in the rising transition, and reducing the input voltage by a threshold voltage of a MOS transistor included in a source follower, and comparing the reduced input voltage with the output voltage when the input voltage is in the falling transition.

The method may further include: providing, by the slew rate compensator, the source current to the load stage when the input voltage exceeds a value obtained by adding the output voltage to a threshold voltage of a MOS transistor of a first comparator; flowing the second compensation current through the second differential mirror circuit based on the source current; decreasing the gate voltages of the first output transistor and the second output transistor of the output stage based on the second compensation current; and allowing the output voltage to increase and follow the rising transition of the input voltage in response to the decrease in the gate voltages of the first output transistor and the second output transistor.

The method may further include: providing the input voltage to the source follower when the input voltage is in the falling transition, reducing the input voltage by the threshold voltage of the MOS transistor included in the source follower, and outputting the reduced input voltage; comparing the reduced input voltage and the output voltage, and receiving the sink current by the slew rate compensator from the load stage when the reduced input voltage becomes lower than a value obtained by subtracting a threshold voltage of a MOS transistor of a second comparator from the output voltage; flowing the first compensation current through the first differential mirror circuit based on the sink current; increasing the gate voltages of the first output transistor and the second output transistor of the output stage based on the first compensation current; and allowing the output voltage to decrease and follow the falling transition of the input voltage in response to the increase in the gate voltages of the first output transistor and the second output transistor.

According to one or more embodiments of the present disclosure, a circuit can be provided that improves the slew rate of a buffer amplifier that is a source drive device, relaxes size constraints, and can be implemented at low power.

The effects of the present disclosure are not limited to the above-described effects, and other effects which are not described herein will become apparent to those skilled in the art from the following detailed description, the drawings and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
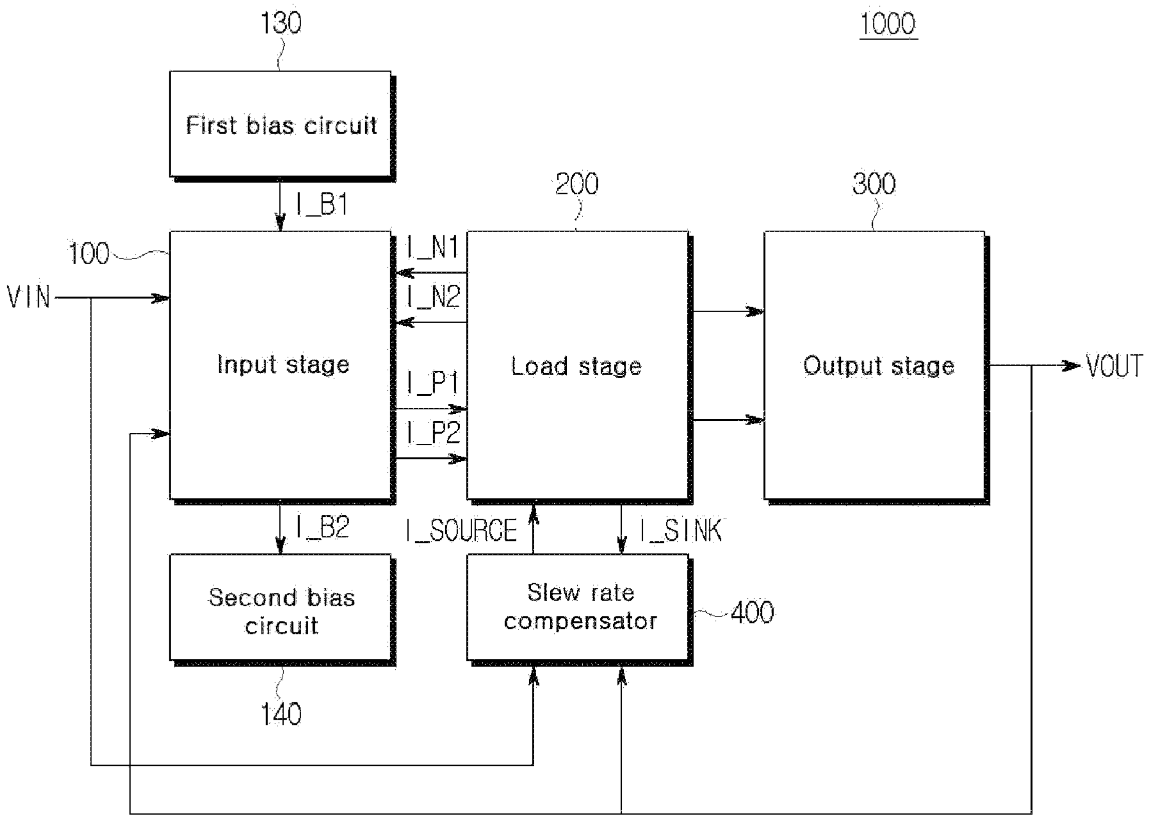
FIG. 1 is a block diagram illustrating a buffer circuit according to an embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items. Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. Due to manufacturing techniques and/or tolerances, variations of the shapes shown in the drawings may occur. Thus, the examples described herein are not limited to the specific shapes shown in the drawings, but include changes in shape that occur during manufacturing. The features of the examples described herein may be combined in various ways as will be apparent after an understanding of the disclosure of this application. Further, although the examples described herein have a variety of configurations, other configurations are possible as will be apparent after an understanding of the disclosure of this application.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present invention may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the storage medium may reside in an application specific integrated circuit (ASIC). The ASIC may be resident within a user's terminal.

Hereinafter, a detailed description will be given as to the embodiments of the present invention with reference to the accompanying drawings in order for those skilled in the art to embody the present invention with ease. But the present invention is susceptible to variations and modifications and not limited to the embodiments described herein.

Figure 2:
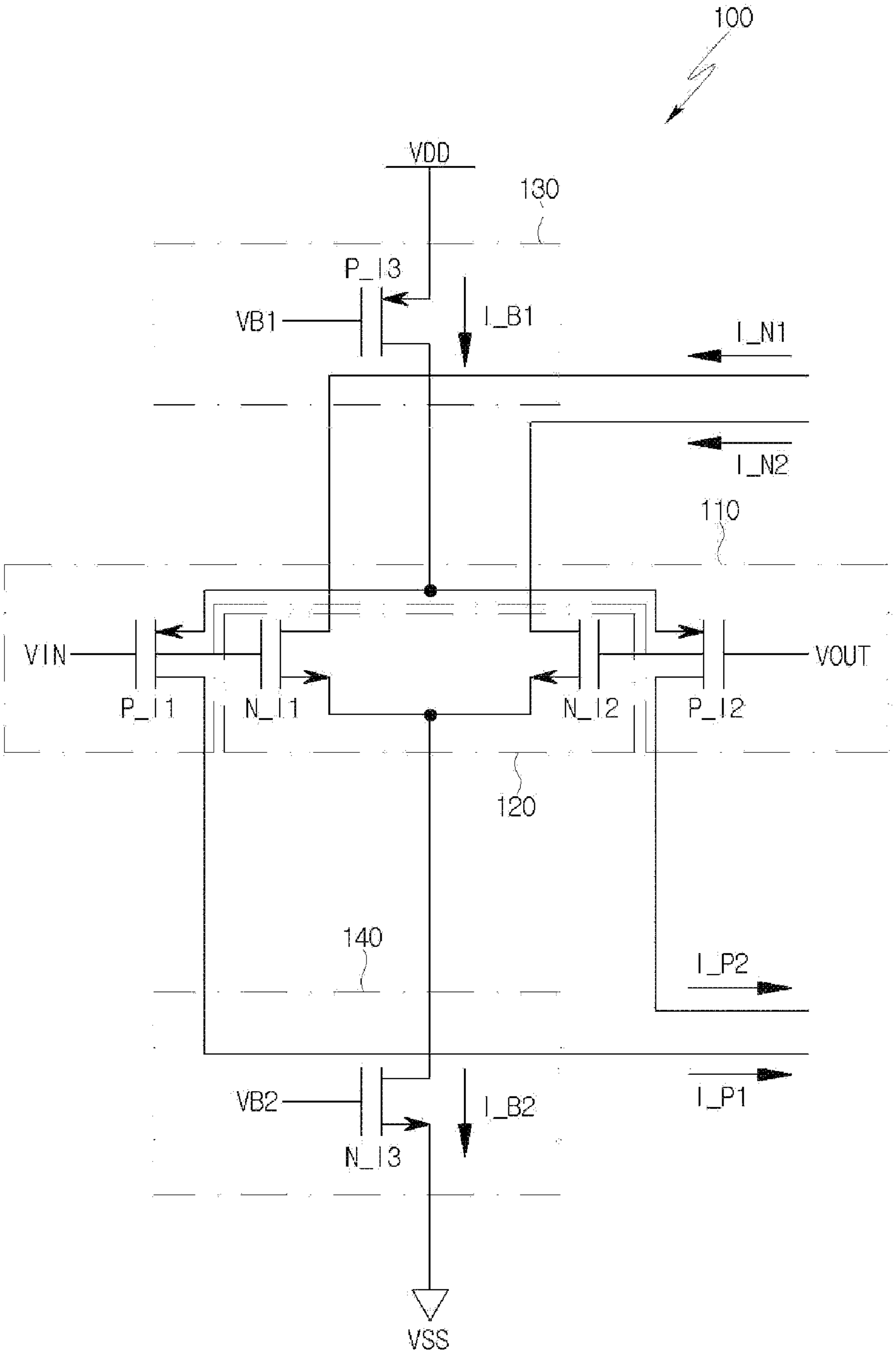
FIG. 2 is a circuit diagram illustrating an input stage and a bias circuit according to an embodiment of the present disclosure.
Figure 3:
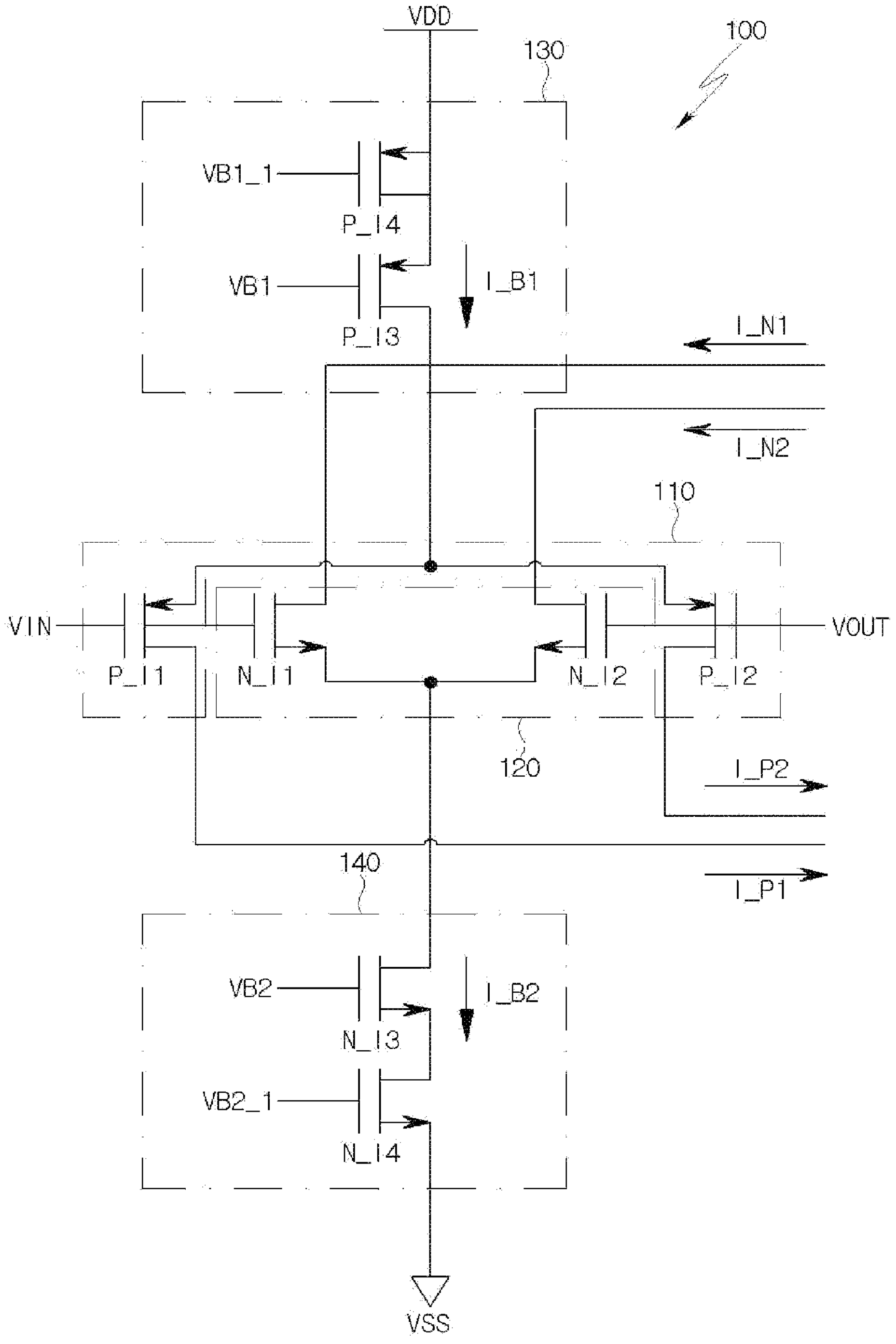
FIG. 3 is a circuit diagram illustrating an input stage and a bias circuit according to another embodiment of the present disclosure.
Figure 4:
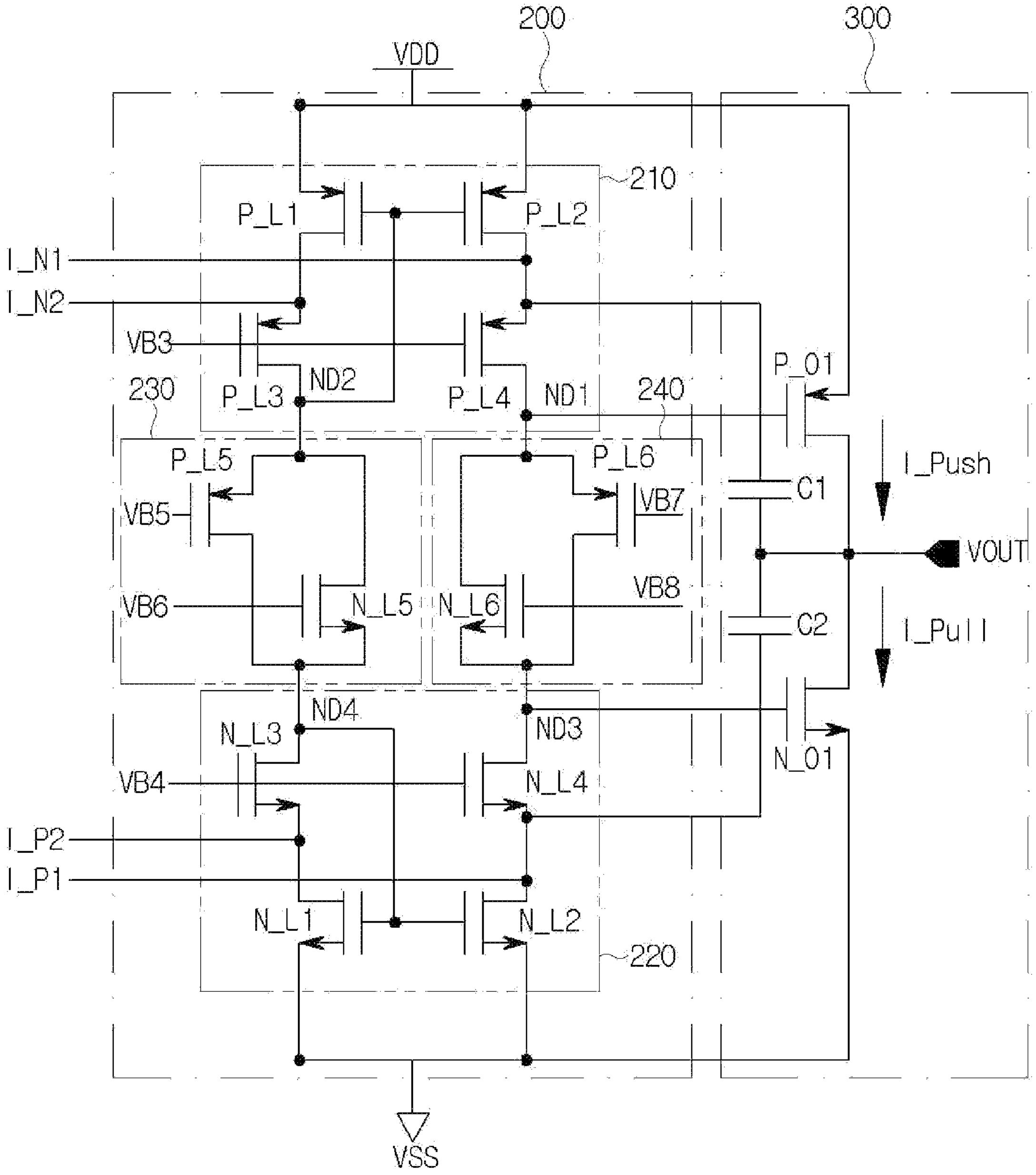
FIG. 4 is a diagram illustrating circuits of a load stage and an output stage according to an embodiment of the present disclosure.
Figure 5:
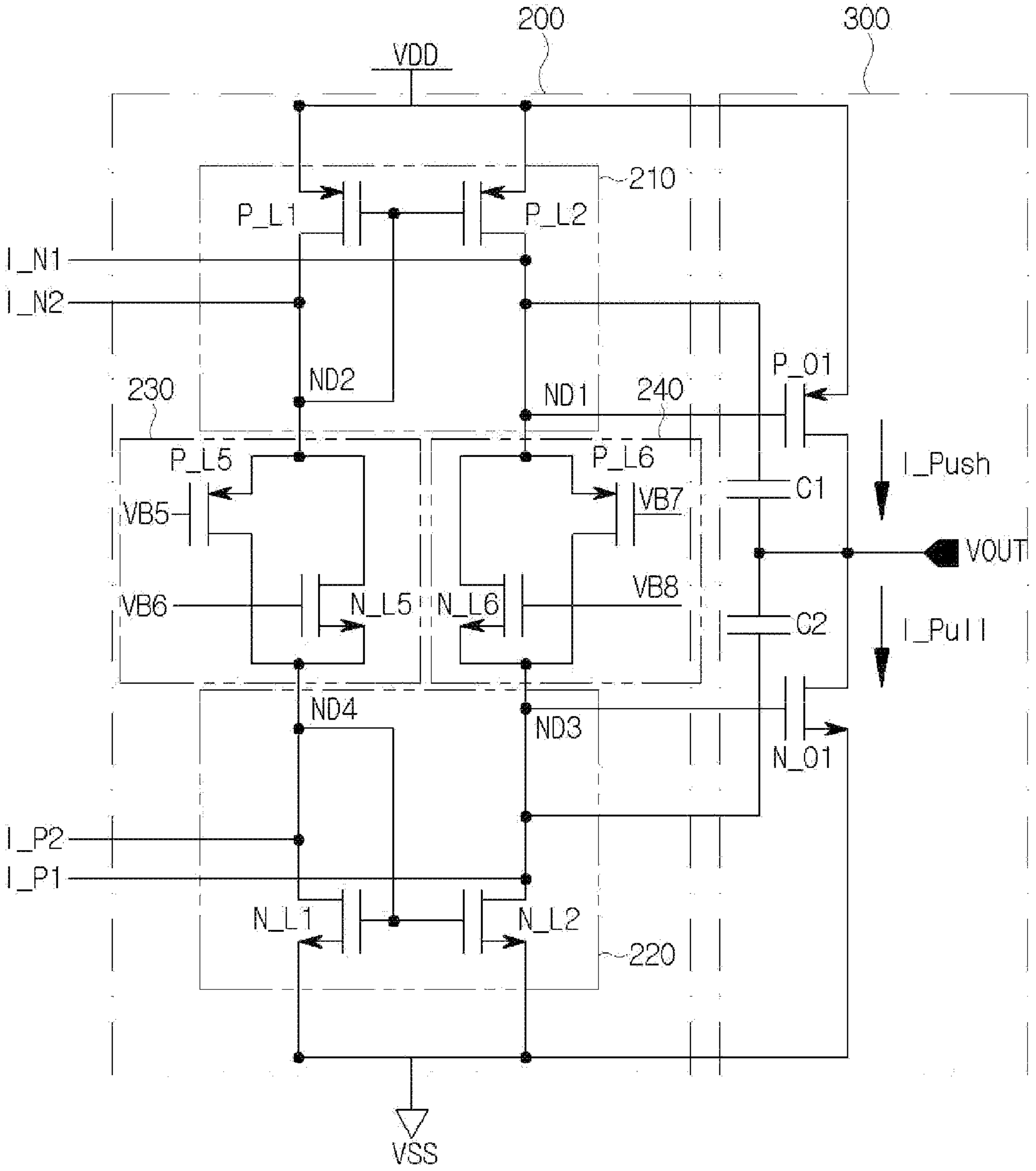
FIG. 5 is a diagram illustrating circuits of a load stage and an output stage according to another embodiment of the present disclosure.
Figure 6:
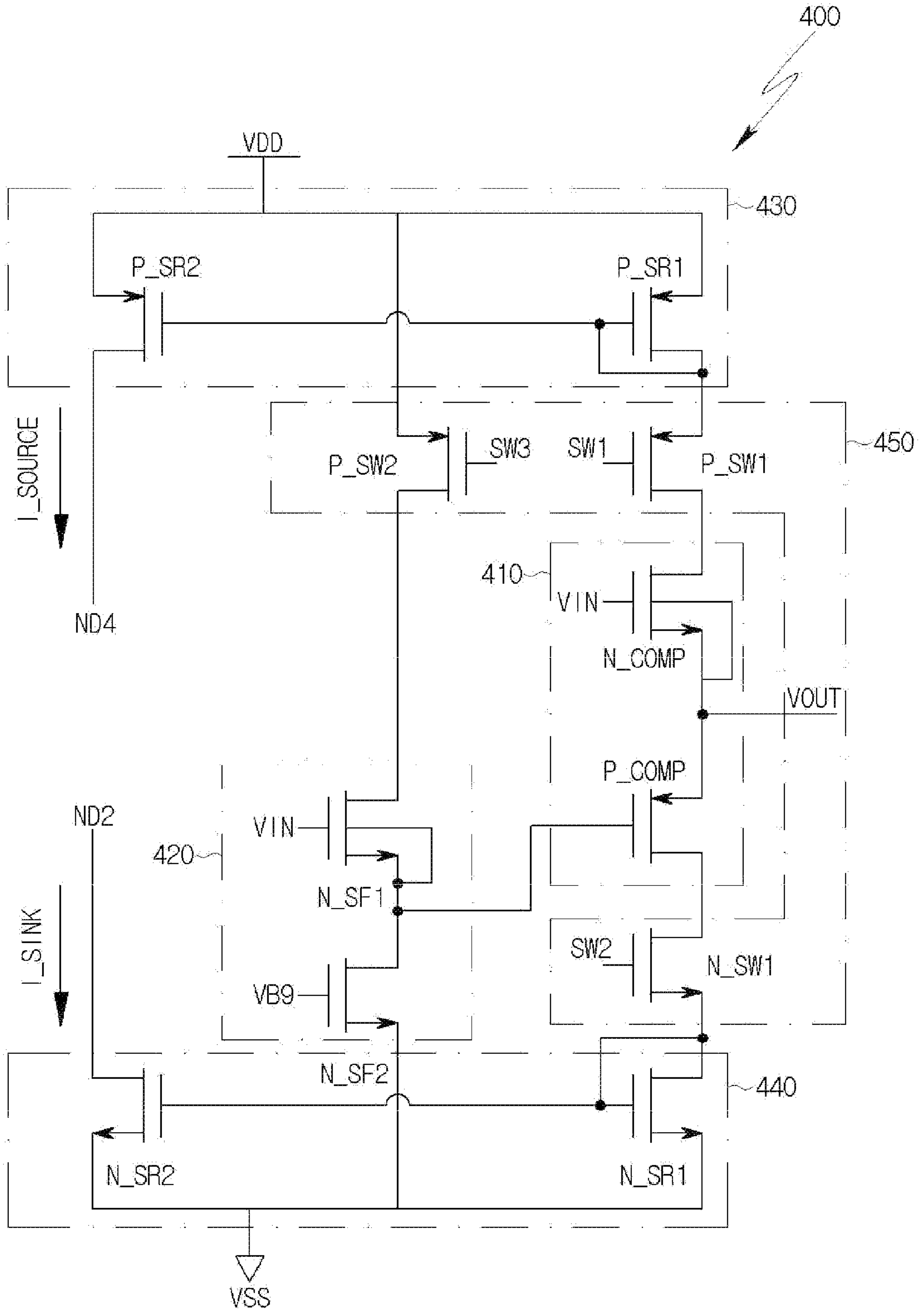
FIG. 6 is a diagram illustrating circuits of a slew rate compensator according to an embodiment of the present disclosure.

FIG. 1 is a block diagram illustrating a buffer circuit according to one or more embodiments of the present disclosure. In the following embodiments, detailed structures of components shown in FIG. 1 will be described with reference to FIGS. 2 to 6. FIG. 2 is a circuit diagram illustrating an input stage and a bias circuit according to one or more embodiments of the present disclosure, FIG. 3 is a circuit diagram illustrating an input stage and a bias circuit according to another embodiment of the present disclosure, FIG. 4 is a diagram illustrating circuits of a load stage and an output stage according to one or more embodiments of the present disclosure, FIG. 5 is a diagram illustrating circuits of a load stage and an output stage according to another embodiment of the present disclosure, and FIG. 6 is a diagram illustrating circuits of a slew rate compensator according to one or more embodiments of the present disclosure.

Referring to FIG. 1, a buffer circuit 1000 according to one or more embodiments of the present disclosure includes an input stage 100, a load stage 200, and an output stage 300, and a slew rate compensator 400. The buffer circuit 1000 amplifies an input voltage VIN to output an output voltage VOUT. When the input voltage VIN increases or decreases, the buffer circuit 1000 may follow the increase or decrease of the input voltage VIN to output an increased or decreased output voltage VOUT. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The buffer circuit 1000 may compare the output voltage VOUT with the input voltage VIN by providing feedback, and regulate the output voltage VOUT based on a difference between the input voltage VIN and the output voltage VOUT. The buffer circuit 1000 may improve the slew rate so that the output voltage VOUT can quickly follow the input voltage VIN with respect to a rising transition of the input voltage VIN. In addition, the buffer circuit 1000 may improve the slew rate so that the output voltage VOUT can quickly follow the input voltage VIN with respect to a falling transition of the input voltage VIN.

The input stage 100 may deliver, to the load stage 200, first and second differential currents I_P1 and I_P2 based on a difference between the input voltage VIN and the output voltage VOUT output by the output stage 300 and fed back. In addition, third and fourth differential currents I_N1 and I_N2 can be supplied and fed back to the input stage 100 from the load stage 200 based on a difference between the input voltage VIN and the output voltage VOUT output by the output stage 300.

Here, a sum of the first and second differential currents I_P1 and I_P2 and a sum of the third and fourth differential currents I_N1 and I_N2 may be equal to each other. For example, when the input voltage VIN is higher than the output voltage VOUT, a second differential current I_P2 and a third differential current I_N1 increase, and a first differential current I_P1 and a fourth differential current I_N2 decrease, so that the sum of the first and second differential currents I_P1 and I_P2 and the sum of the third and fourth differential currents I_N1 and I_N2 may be equal to each other.

The input stage 100 may have a rail-to-rail structure that includes double input stages. The input stage 100 may be connected between a power supply voltage VDD and a ground voltage VSS.

The input stage 100 may be connected to a first bias circuit 130. The input stage 100 may receive a first bias current I_B1 for operating an internal PMOS transistor from the first bias circuit 130. Here, the first bias current I_B1 may serve as a constant current source to keep the sum of first and second differential currents I_P1 and I_P2 flowing in a PMOS transistor within the input stage 100 constant.

The input stage 100 may be connected to the second bias circuit 140. The input stage 100 may provide a second bias current I_B2 to the second bias circuit 140 so that an internal NMOS transistor operates. Here, the second bias current I_B2 may serve as a constant current source to keep the sum of third and fourth differential currents I_N1 and I_N2 flowing in the NMOS transistor within the input stage 100 constant.

The first bias circuit 130 may be disposed between the power supply voltage VDD and the input stage 100. The first bias circuit 130 may be connected to the power supply voltage VDD and the input stage 100. The first bias circuit 130 may provide the first bias current I_B1 to the input stage 100 as a constant current source.

The second bias circuit 140 may be disposed between the ground voltage VSS and the input stage 100. The second bias circuit 140 may be connected to the ground voltage VSS and the input stage 100. The second bias circuit 140 may receive the second bias current I_B2 from the input stage 100 as a constant current source.

The load stage 200 may receive the first and second differential currents I_P1 and I_P2 from the input stage 100. The load stage 200 may provide the third and fourth differential currents I_N1 and I_N2 to the input stage 100. The load stage 200 may receive the first and second differential currents I_P1 and I_P2 from the input stage 100 based on the difference between the input voltage VIN and the output voltage VOUT. The load stage 200 may provide the third and fourth differential currents I_N1 and I_N2 to the input stage 100 based on the difference between the input voltage VIN and the output voltage VOUT.

The load stage 200 may increase or decrease the gate voltages of the output transistors of the output stage 300 based on the first to fourth differential currents I_P1, I_P2, I_N1, and I_N2. The load stage 200 may perform a current mirroring operation based on the first to fourth differential currents I_P1, I_P2, I_N1, and I_N2, and allow the current to flow into nodes connected to gate terminals of the output transistors of the output stage 300, or allow the current to flow out of the nodes.

When the current flows into nodes connected to the gate terminals of the output transistors of the output stage 300, the gate voltages of the output transistors may increase. On the other hand, when the current flows out of the nodes connected to the gate terminals of the output transistors, the gate voltages of the output transistors may decrease. When the gate voltages of the output transistors increase, the output voltage VOUT decreases. On the other hand, when the gate voltages of the output transistors decrease, the output voltage VOUT may increase.

In an example, the load stage 200 may provide a sink current I_SINK to the slew rate compensator 400 when the input voltage VIN has a falling transition. The load stage 200 may generate a first compensation reference current and a first compensation current obtained by mirroring the first compensation reference current based on the provided sink current. The load stage 200 may provide the first compensation current to nodes connected to gate terminals of the output transistors of the output stage 300. Accordingly, the gate voltages of the output transistors of the output stage 300 may increase and the output voltage VOUT may decrease.

In an example, the load stage 200 may receive a source current I_SOURCE from the slew rate compensator 400 when the input voltage VIN has the rising transition. The load stage 200 may generate a second compensation reference current and a second compensation current obtained by mirroring the second compensation reference current based on the received source current I_SOURCE. The load stage 200 may receive the second compensation current from the nodes connected to the gate terminals of the output transistors of the output stage 300. Accordingly, the gate voltages of the output transistors of the output stage 300 may decrease and the output voltage VOUT may increase.

The gate voltages of the output transistors of the output stage 300 may increase or decrease while voltages of the nodes of the output stage 300 connected to the load stage 200 increase or decrease. When the gate voltages of the output transistors of the output stage 300 increase, the output voltage VOUT of the output stage 300 may decrease. On the other hand, when the gate voltages of the output transistors of the output stage 300 decrease, the output voltage VOUT of the output stage 300 may increase.

The slew rate compensator 400 may compare the input voltage VIN with the output voltage VOUT, and provide the source current I_SOURCE to the load stage 200, or receive the sink current I_SINK from the load stage 200.

In an example, when the input voltage VIN has the rising transition, a time point occurs when a difference between the input voltage VIN and the output voltage VOUT exceeds a threshold voltage of a NMOS transistor of a first comparator, and at this time, the slew rate compensator 400 may provide the source current I_SOURCE to the load stage 200. The load stage 200 may have a mirror structure with nodes receiving the source current I_SOURCE and let the second compensation current flow out of the nodes connected to gate terminals of the output transistors of the output stage 300. When the second compensation current flows out of the nodes connected to the gate terminals of the output transistors, the gate voltages of the output transistors of the output stage 300 may decrease, and the output voltage VOUT thereof may increase.

In an example, when the slew rate compensator 400 has a falling transition, a time point occurs when a difference between the input voltage is reduced by a threshold voltage of a MOS transistor of the source follower and the output voltage exceeds a threshold voltage of a PMOS transistor of a second comparator. At this time, the slew rate compensator 400 may receive the sink current I_SINK from the load stage 200. The load stage 200 may have a mirror structure with nodes providing the sink current I_SINK and let the first compensation current flow into nodes connected to the gate terminals of the output transistors of the output stage 300. When the first compensation current flows into the nodes connected to the gate terminals of the output transistors of the output stage 300, the gate voltages of the output transistors of the output stage 300 may increase, and the output voltage VOUT thereof may decrease.

Hereinafter, a detailed structure of the buffer circuit according to one or more embodiments of the present disclosure will be described with reference to FIGS. 2 to 6.

Referring to FIGS. 2 and 4, the input stage 100 includes a first input stage 110 having PMOS transistors P_I1 and P_I2, a second input stage 120 having NMOS transistors N_I1 and N_I2, the first bias circuit 130 providing the first bias current I_B1 to the first input stage 110, and a second bias circuit 140 providing the second bias current I_B2 to the second input stage 120.

The first input PMOS transistor P_I1 may have a gate receiving the input voltage VIN, a source connected to the first bias circuit 130 in common with the second input stage PMOS transistor P_I2, and a drain connected to a second differential mirror circuit 220 of the load stage 200. The first input stage PMOS transistor P_I1 may provide the first differential current I_P1 output based on the input voltage VIN to a drain of a second load stage NMOS transistor N_L2 of the second differential mirror circuit 220 of the load stage 200.

The second input stage PMOS transistor P_I2 may have a gate receiving the output voltage VOUT, a source connected to the first bias circuit 130 in common with the first input stage PMOS transistor P_I1, and a drain connected to the second differential mirror circuit 220 of the load stage 200. The second input stage PMOS transistor P_I2 may provide the second differential current I_P2 output based on the output voltage VOUT to a drain of a first load stage NMOS transistor N_L1 of the second differential mirror circuit 220 of the load stage 200.

When the input voltage VIN and the output voltage VOUT are the same, the first differential current I_P1 and the second differential current I_P2 are provided to the load stage 200 with the same current value, and when there is a difference between the input voltage VIN and the output voltage VOUT, a difference is generated in the current values of the first differential current I_P1 and the second differential current I_P2 in proportion to the difference, and the difference may be provided to the load stage 200.

In an example, when the input voltage VIN changes to 'L (e.g. VSS)' in a state where the input voltage VIN and the output voltage VOUT are identically 'H (e.g. VDD)', if the voltage between the gate and the source of the first input stage PMOS transistor P_I1, that is, a difference between the input voltage VIN and the power supply voltage VDD is greater than the threshold voltage, the first input stage PMOS transistor P_I1 is turned on, and a current flows, thus, the first differential current I_P1 has a value greater than 0. The first differential current I_P1 may further increase as the input voltage VIN decreases. In this case, the second differential current I_P2 may continue to be 0 during an interval in which the output voltage VOUT does not change at 'H'.

In another example, when the input voltage VIN changes to 'H' in a state where the input voltage VIN and the output voltage VOUT are 'L', as the voltage (the difference between the input voltage VIN and the power supply voltage VDD) between the gate and the source of the first input stage PMOS transistor P_I1 gradually decreases, the first differential current I_P1 also decreases accordingly, and when the voltage therebetween is smaller than the threshold voltage, the first differential current I_P1 becomes 0. In this case, the second differential current I_P2 may increase as much as the first differential current I_P1 decreases. This is because a sum of the first differential current I_P1 and the second differential current I_P2 is equal to the first bias current I_B1.

The second input stage 120 may include a first input stage NMOS transistor N_I1 and a second input stage NMOS transistor N_I2.

The first input stage NMOS transistor N_I1 may have a gate receiving the input voltage VIN, a source connected to the second bias circuit 140 in common with the second input stage NMOS transistor N_I2, and a drain connected to a first differential mirror circuit 210 of the load stage 200. The first input stage NMOS transistor N_I1 may receive the third differential current I_N1 from a drain of a second load stage PMOS transistor P_L2 of the first differential mirror circuit 210 of the load stage 200 based on the input voltage VIN.

The second input stage NMOS transistor N_I2 may have a gate receiving the output voltage VOUT, a source connected to the second bias circuit 140 in common with the first input stage NMOS transistor N_I1, and a drain connected to the first differential mirror circuit 210 of the load stage 200. The second input stage NMOS transistor N_I2 may receive the fourth differential current I_N2 from a drain of a first load stage PMOS transistor P_L1 of the first differential mirror circuit 210 of the load stage 200 based on the output voltage VOUT.

When the input voltage VIN and the output voltage VOUT are the same, the second input stage 120 receives the third differential current I_N1 and the fourth differential current I_N2, which are the same current values, from the load stage 200, and when there is a difference between the input voltage VIN and the output voltage VOUT, a difference is generated in the current values of the third differential current I_N1 and the fourth differential current I_N2, which are received from the load stage 200, in proportion to the difference. Accordingly, the difference information between the input voltage VIN and the output voltage VOUT may be provided to the load stage 200.

In an example, when the input voltage VIN changes to 'H' in a state where the input voltage VIN and the output voltage VOUT are both 'L', if the voltage (the difference between the input voltage VIN and the ground voltage VSS) between the gate and the source of the first input stage NMOS transistor N_I1 becomes greater than the threshold voltage, the first input stage NMOS transistor N_I1 is turned on and a current flows, and thus, the third differential current I_N1 has a value greater than 0. The third differential current I_N1 may be further increased as the input voltage VIN increases. In this case, the fourth differential current I_N2 may continue to be 0 during an interval in which the output voltage VOUT does not change at 'L'.

In another example, when the input voltage VIN changes to 'L' in a state where the input voltage VIN and the output voltage VOUT are both 'H', as the voltage (the difference between the input voltage VIN and the ground voltage VSS) between the gate and the source of the first input stage NMOS transistor N_I1 gradually decreases, the third differential current I_N1 also decreases accordingly, and when the voltage therebetween is smaller than the threshold voltage, the third differential current I_N1 becomes 0. In this case, the fourth differential current I_N2 may increase as much as the third differential current I_N1 decreases. This is because a sum of the third differential current I_N1 and the fourth differential current I_N2 is equal to the second bias current I_B2. Referring to FIG. 3, the first bias circuit 130 may be disposed between the power supply voltage VDD and the input stage 100. The first bias circuit 130 may be connected to the power supply voltage VDD and the input stage 100. The first bias circuit 130 may provide the first bias current I_B1 to the input stage 100 as a constant current source. The first bias circuit 130 may be configured with one PMOS transistor P_I3 or may be configured with two PMOS transistors P_I3 and P_I4 connected in series in a cascode structure.

The second bias circuit 140 may be disposed between the ground voltage VSS and the input stage 100. The second bias circuit 140 may be connected to the ground voltage VSS and the input stage 100. The second bias circuit 140 may receive the second bias current I_B2 from the input stage 100 as a constant current source. The second bias circuit 140 may be configured with one NMOS transistor N_I3 or may be configured with two NMOS transistors N_I3 and N_I4 connected in series in a cascode structure.

Referring to FIGS. 4 and 6, the load stage 200 may include a first differential mirror circuit 210, the second differential mirror circuit 220, a third bias circuit 230, and a fourth bias circuit 240.

In an example, the first differential mirror circuit 210 has a cascode structure and may perform a current mirroring operation.

The first differential mirror circuit 210 serves as a constant current source and supplies a current to the input stage 100, the third bias circuit 230 and the fourth bias circuit 240, and may apply a voltage to gate terminals of the first output transistor P_O1 and the second output transistor N_O1 of the output stage 300.

The first differential mirror circuit 210 may include the first load stage PMOS transistor P_L1 and the second load stage PMOS transistor P_L2 performing a current mirroring operation, and the third load stage PMOS transistor P_L3 and the fourth load stage PMOS transistor P_L4 connected in series to the first load stage PMOS transistor P_L1 and second load stage PMOS transistor P_L2 to form a cascode structure to have a high voltage gain.

Specifically, the first load stage PMOS transistor P_L1 of the first differential mirror circuit 210 may have a gate connected to the third bias circuit 230 in common with the second load stage PMOS transistor P_L2, a drain connected to the third load stage PMOS transistor P_L3, and a source connected to the power supply voltage VDD.

The second load stage PMOS transistor P_L2 of the first differential mirror circuit 210 may have a gate connected to the third bias circuit 230 in common with the first load stage PMOS transistor P_L1, a drain connected to the fourth load stage PMOS transistor P_L4, and a source connected to the power supply voltage VDD.

The third load stage PMOS transistor P_L3 of the first differential mirror circuit 210 may be connected between the third bias circuit 230 and the first load stage PMOS transistor P_L1. The third load stage PMOS transistor P_L3 may have a gate receiving a third bias voltage VB3, a drain connected to the gate of the first load stage PMOS transistor P_L1 and a second node ND2 to provide the sink current I_SINK to the slew rate compensator 400, and a source connected to the first load stage PMOS transistor P_L1.

The fourth load stage PMOS transistor P_L4 of the first differential mirror circuit 210 may be connected between the fourth bias circuit 240 and the second load stage PMOS transistor P_L2. The fourth load stage PMOS transistor P_L4 may have a gate receiving the third bias voltage VB3, a drain connected to a first node ND1 which is connected to the gate terminal of the first output transistor P_O1 of the output stage 300, and a source connected to the second load stage PMOS transistor P_L2.

In an example, when the first differential mirror circuit 210 provides the sink current I_SINK from the second node ND2 to the slew rate compensator 400, a gate voltage of the first load stage PMOS transistor P_L1 connected to the second node ND2 may decrease. When the gate voltage of the first load stage PMOS transistor P_L1 decreases, the first compensation reference current may flow in a branch to which the first load stage PMOS transistor P_L1 is connected.

When the first compensation reference current flows in the first load stage PMOS transistor P_L1, the first compensation current obtained by mirroring the first compensation reference current may flow in the branch to which the second load stage PMOS transistor P_L2, which has a mirroring structure with the first load stage PMOS transistor P_L1, is connected.

Here, the first compensation current may be a current added to the bias current flowing through the second load stage PMOS transistor P_L2 when the second load stage PMOS transistor P_L2 is in a steady state. When the first compensation current is added and flows from the second load stage PMOS transistor P_L2 to the first node ND1, the voltage at the first node ND1 may increase. In addition, a voltage of a third node ND3 connected to the first node ND1 centering around about elements of the fourth bias circuit 240 may also increase. That is, a gate voltage of the first output transistor P_O1 connected to the first node ND1 and a gate voltage of a second output transistor N_O1 connected to the third node ND3 may increase.

As will be described later, the first output transistor P_O1 is configured with a PMOS transistor, and when the gate voltage increases, a push current I_Push flowing from the first output transistor P_O1 to the output terminal may decrease, and the second output transistor N_O1 is configured with an NMOS transistor, and when the gate voltage increases, a pull current I_Pull flowing from the output terminal to the second output transistor N_O1 may increase. Therefore, since the push current I_Push provided to the output terminal decreases and the pull current I_Pull provided by the output terminal increases, the output voltage VOUT output by the output terminal rapidly decreases, thereby quickly following a falling transition of the input voltage.

In an example, the second differential mirror circuit 220 has a cascode structure and may perform a current mirroring operation.

In addition, the second differential mirror circuit 220 serving as a constant current source, receives a current from the input stage 100, the third bias circuit 230, and the fourth bias circuit 240, and applies a voltage to gate terminals of the first and second output transistors P_O1 and N_O1 of the output stage.

The second differential mirror circuit 220 may include the first and second load stage NMOS transistors N_L1 and N_L2 performing a current mirroring operation, and the third and fourth load stage NMOS transistors N_L3 and N_L4 connected in series to the first and second load stage NMOS transistors N_L1 and N_L2 to form a cascode structure to have a high voltage gain.

Specifically, the first load stage NMOS transistor N_L1 of the second differential mirror circuit 220 may have a gate connected to the third bias circuit 230 in common with the second load stage NMOS transistor N_L2, a drain connected to a third output stage NMOS transistor N_L3, and a source connected to the ground voltage VSS.

The second load stage NMOS transistor N_L2 of the second differential mirror circuit 220 may have a gate connected to the third bias circuit 230 in common with the first load stage NMOS transistor N_L1, a drain connected to a fourth output stage NMOS transistor N_L4, and a source connected to the ground voltage VSS.

A third load stage NMOS transistor N_L3 of the second differential mirror circuit 220 may be connected between the third bias circuit 230 and the first load stage NMOS transistor N_L1. The third load stage NMOS transistor N_L3 may have a gate receiving a fourth bias voltage VB4, a drain connected to a gate of the first load stage NMOS transistor N_L1 and a fourth node ND4 to receive the source current I_SOURCE from the slew rate compensator 400, and a source connected to the first load stage NMOS transistor N_L1.

A fourth load stage NMOS transistor N_L4 of the second differential mirror circuit 220 may be connected between the fourth bias circuit 240 and the second load stage NMOS transistor N_L2. The fourth load stage NMOS transistor N_L4 may have a gate receiving the fourth bias voltage VB4, a drain connected to the third node ND3 which is connected to a gate terminal of a second output transistor N_O1 and the fourth bias circuit 240, and a source connected to the second load stage NMOS transistor N_L2.

In an example, when the second differential mirror circuit 220 receives the source current I_SOURCE at the fourth node ND4 from the slew rate compensator 400, a gate voltage of the first load stage NMOS transistor N_L1 connected to the fourth node ND4 may increase. When the gate voltage of the first load stage NMOS transistor N_L1 increases, the second compensation reference current may flow in a branch to which the first load stage NMOS transistor N_L1 is connected. When the second compensation reference current flows in the first load stage NMOS transistor N_L1, the second compensation current obtained by mirroring the second compensation reference current may flow in the branch to which the second load stage NMOS transistor N_L2, which has a mirroring structure with the first load stage NMOS transistor N_L1, is connected.

Here, the second compensation current may be a current added to the bias current flowing through the second load stage NMOS transistor N_L2 when the second load stage NMOS transistor N_L2 is in a steady state. When the second compensation current is added to the second load stage NMOS transistor N_L2 at the third node ND3 and flows out thereof, the voltage at the third node ND3 may decrease. In addition, a voltage of the first node ND1 connected to the third node ND3 centering around about elements of the fourth bias circuit 240 may also decrease. That is, a gate voltage of the first output transistor P_O1 connected to the first node ND1 and a gate voltage of the second output transistor N_O1 connected to the third node ND3 may decrease.

As will be described later, the first output transistor P_O1 is configured with a PMOS transistor, and when the gate voltage decreases, a push current I_Push flowing from the first output transistor P_O1 to the output terminal may increase, and the second output transistor N_O1 is configured with an NMOS transistor, and when the gate voltage decreases, a pull current I_Pull flowing from the output terminal to the second output transistor N_O1 may decrease. Therefore, since the push current I_Push provided to the output terminal increases and the pull current I_Pull provided by the output terminal decreases, the output voltage VOUT output by the output terminal rapidly increases, thereby quickly following the rising transition of the input voltage.

The third bias circuit 230 may include a fifth load stage PMOS transistor P_L5 receiving a fifth bias voltage VB5, and a fifth load stage NMOS transistor N_L5 receiving a sixth bias voltage VB6. The third bias circuit 230 may be disposed between the first differential mirror circuit 210 and the second differential mirror circuit 220. The third bias circuit 230 may control a static state operation and an amplification operation of the first differential mirror circuit 210 and the second differential mirror circuit 220. Further, the third bias circuit 230 is used as a floating current source and may regulate the voltages of the second node ND2 and the fourth node ND4 by means of high impedance.

The fourth bias circuit 240 may include a sixth load stage PMOS transistor P_L6 receiving a seventh bias voltage VB7 and a sixth load stage NMOS transistor N_L6 receiving an eighth bias voltage VB8. The fourth bias circuit 240 may be connected between the first differential mirror circuit 210 and the second differential mirror circuit 220. The fourth bias circuit 240 may control an operation in a static state and an amplification operation of the first differential mirror circuit 210 and the second differential mirror circuit 220. Also, the fourth bias circuit 240 may be used as a floating current source and may regulate voltages of the first node ND1 and the third node ND3 by means of high impedance.

Referring to FIG. 5, in an example, the first differential mirror circuit 210 may perform a current mirroring operation without having a cascode structure. Also, the second differential mirror circuit 220 may perform a current mirroring operation without having a cascode structure.

The first differential mirror circuit 210 and the second differential mirror circuit 220 illustrated in FIG. 5 may operate in the similar manner as the first differential mirror circuit 210 and the second differential mirror circuit 220 illustrated in FIG. 4, except for the cascode structure.

If the first differential mirror circuit 210 and the second differential mirror circuit 220 have the cascode structure, the structure serves to increase the output impedance of a component used as the constant current source, thereby obtaining a high voltage gain. However, the disadvantages are that the process is more complicated and the layout area is increased because more components such as transistors are used. Therefore, depending on the purpose of obtaining a high voltage gain or simplifying the process and reducing the layout area, the first differential mirror circuit 210 and the second differential mirror circuit 220 shown in FIG. 4 or 5 may be provided.

Referring back to FIGS. 4 and 6, the slew rate compensator 400 may include a comparator 410, a source current circuit 430 and a sink current circuit 440. In addition, the slew rate compensator 400 may further include a slew rate compensation switch 450.

The comparator 410 may include a first comparator N_COMP and a second comparator P_COMP.

The first comparator N_COMP may compare a difference between the input voltage VIN and the output voltage VOUT, and may switch to the ON or OFF operating state based on the difference between the input voltage VIN and the output voltage VOUT.

The first comparator N_COMP may be configured with the NMOS transistor having a gate receiving the input voltage VIN, a drain directly connected to the source current circuit 430, or connected to the source current circuit 430 with a first slew rate compensation switch P_SW1 therebetween, and a source receiving the output voltage VOUT.

The second comparator P_COMP may compare a difference between a reduced input voltage VIN output by the source follower 420 and an output voltage VOUT, and based on the difference between the reduced input voltage VIN and the output voltage VOUT, the second comparator P_COMP may switch to ON or OFF operating states.

The second comparator P_COMP may be configured with the PMOS transistor having a gate receiving the reduced input voltage VIN output by the source follower 420, a drain directly connected to the sink current circuit 440, or connected to the sink current circuit 440 with a second slew rate compensation switch N_SW1 therebetween, and a source receiving the output voltage VOUT in common with the first comparator N_COMP.

In an example, the second comparator P_COMP uses the reduced input voltage VIN as a gate voltage and compares the input voltage VIN with the output voltage VOUT, so that a channel of the PMOS transistor inside the second comparator P_COMP can be formed more quickly, and the second comparator P_COMP can quickly be in an ON operating state. Also, by lowering the minimum operating voltage for the falling transition of the input voltage VIN, a wider range of the input voltage VIN can be used.

In an example, unlike the PMOS transistor of the second comparator P_COMP, the NMOS transistor of the first comparator N_COMP may include a body connected to the source to receive the output voltage VOUT.

The NMOS transistor of the first comparator N_COMP provides the same output voltage VOUT to the source and the body, so that the threshold voltage of the transistor can be constantly used even if the body voltage changes. When the body voltage of the NMOS transistor of the first comparator N_COMP is regulated, the NMOS transistor must be separated into a deep N-well region, whereas an N-well of a general PMOS transistor whose body voltage is the power supply voltage VDD can be used to reduce the layout area.

On the other hand, when the body voltage of the PMOS transistor of the second comparator P_COMP is regulated, since an N-well of a general PMOS transistor whose body voltage is the power supply voltage VDD must be separated, the layout area can be increased. Accordingly, as described above, the body of the NMOS transistor of the first comparator N_COMP may be connected to the body in common with the source, and the PMOS transistor of the second comparator P_COMP may not be connected to the body in common with the source.

The source follower 420 may reduce the input voltage VIN by the threshold voltage of the MOS transistor and provide the reduced input voltage VIN to a gate terminal of the second comparator P_COMP.

The source follower 420 may include a first source follower NMOS transistor N_SF1 having a gate receiving the input voltage VIN, a drain directly connected to the power supply voltage VDD or connected to the power supply voltage VDD with a third slew rate compensation switch P_SW2 interposed therebetween, a source connected to a gate of the PMOS transistor of the second comparator P_COMP and a body connected to the source. In addition, the source follower 420 may include a second source follower NMOS transistor N_SF2 having a gate receiving a ninth bias voltage VB9, a drain connected to the source of the first source follower NMOS transistor N_SF1, and a source connected to the ground voltage VSS to provide a bias current.

The source follower 420 may reduce the input voltage VIN by a threshold voltage of the first source follower NMOS transistor N_SF1 and provide the reduced input voltage VIN to the gate terminal of the second comparator P_COMP.

In an example, when a magnitude of the input voltage VIN exceeds a value obtained by adding the output voltage to a threshold voltage of the NMOS transistor of the first comparator N_COMP, the first comparator N_COMP may switch to an ON state, and the second comparator P_COMP may switch to an OFF state. Accordingly, the source current circuit 430 may be activated and the sink current circuit 440 may be inactivated. The source current circuit 430 may be activated to provide the source current I_SOURCE to the load stage 200.

In another example, when a magnitude of the reduced input voltage VIN output by the source follower 420 becomes lower than a value obtained by subtracting a threshold voltage of the PMOS transistor of the second comparator P_COMP from the output voltage, the first comparator N_COMP may switch to an OFF state, and the second comparator P_COMP may switch to an ON state. Accordingly, the source current circuit 430 may be inactivated and the sink current circuit 440 may be activated. When the sink current circuit 440 is activated, it may receive the sink current I_SINK from the load stage 200.

The source current circuit 430 may be directly connected to the first comparator N_COMP or connected to the first comparator N_COMP by disposing the slew rate compensation switch 450 between the first comparator N_COMP and the source current circuit 430.

The source current circuit 430 may be connected to the load stage 200 and provide the source current I_SOURCE to the load stage 200. The source current circuit 430 may provide the source current I_SOURCE to the load stage 200 based on the difference between the input voltage VIN and the output voltage VOUT.

The source current circuit 430 may be activated when the first comparator N_COMP is in an ON operating state.

The source current circuit 430 may include first and second source PMOS transistors P_SR1 and P_SR2.

Specifically, the first source PMOS transistor P_SR1 of the source current circuit 430 may be directly connected to the first comparator N_COMP, or have a gate connected to the first comparator N_COMP with the first slew rate compensation switch P_SW1 interposed therebetween, a drain connected to the gate, and a source receiving the power supply voltage VDD.

The second source PMOS transistor P_SR2 of the source current circuit 430 may include a gate connected to the gate of the first source PMOS transistor P_SR1, a drain connected to the fourth node ND4 of the load stage 200 having a mirror structure with the third node ND3 of the load stage 200 connected to a gate terminal of the second output transistor N_O1, and a source receiving the power supply voltage VDD.

The first source PMOS transistor P_SR1 of the source current circuit 430 is connected to the first comparator N_COMP to allow a source reference current to flow therein. The second source PMOS transistor P_SR2 of the source current circuit 430 has a current mirror structure based on the first source PMOS transistor P_SR1 and mirrors the source reference current such that the source current I_SOURCE may flow therein.

The sink current circuit 440 may be directly connected to the second comparator P_COMP, or connected to the second comparator P_COMP by disposing the slew rate compensation switch 450 between the sink current circuit 440 and the second comparator P_COMP.

The sink current circuit 440 may be connected to the load stage 200 to receive the sink current I_SINK from the load stage 200. The sink current circuit 440 may receive the sink current I_SINK from the load stage 200 based on the difference between the reduced input voltage VIN and the output voltage VOUT.

The sink current circuit 440 may be activated when the second comparator P_COMP is in an ON operating state.

The sink current circuit 440 may include first and second sink NMOS transistors N_SR1 and N_SR2.

Specifically, the first sink NMOS transistor N_SR1 of the sink current circuit 440 may have a gate connected to the second comparator P_COMP, or connected to the second comparator P_COMP with the second slew rate compensation switch N_SW1 therebetween, a drain connected to the gate, and a source connected to the ground voltage VSS.

The second sink NMOS transistor N_SR2 of the sink current circuit 440 may have a gate connected to the gate of the first sink NMOS transistor N_SR1, a drain connected to the second node ND2 of the load stage 200 having a mirror structure with the first node ND1 of the load stage 200 connected to a gate terminal of the first output transistor P_O1 and a source connected to the ground voltage VSS.

The first sink NMOS transistor N_SR1 of the sink current circuit 440 is connected to the second comparator P_COMP to allow a sink reference current to flow therein. The second sink NMOS transistor N_SR2 of the sink current circuit 440 has a current mirror structure based on the first sink NMOS transistor N_SR1 and mirrors the sink reference current so that the sink current I_SINK may flow therein.

The slew rate compensation switch 450 includes the first slew rate compensation switch P_SW1 and the second slew rate compensation switch N_SW1, and each of them may determine whether to operate the source current circuit 430 or the sink current circuit 440. In addition, the slew rate compensation switch 450 may include a third slew rate compensation switch P_SW2 and determine whether to operate the source follower 420.

The first slew rate compensation switch P_SW1 may be located and connected between the first comparator N_COMP and the source current circuit 430. The first slew rate compensation switch P_SW1 may block a current flowing between the source current circuit 430 and the first comparator N_COMP based on a first switch signal SW1. Also, the first slew rate compensation switch P_SW1 may control the intensity of a current flowing between the source current circuit 430 and the first comparator N_COMP based on the first switch signal SW1.

The second slew rate compensation switch N_SW1 may be located and connected between the second comparator P_COMP and the sink current circuit 440. The second slew rate compensation switch N_SW1 may block a current flowing between the sink current circuit 440 and the second comparator P_COMP based on a second switch signal SW2. Also, the second slew rate compensation switch N_SW1 may control the intensity of a current flowing between the sink current circuit 440 and the second comparator P_COMP based on the second switch signal SW2.

The third slew rate compensation switch P_SW2 may be located and connected between the power supply voltage VDD and the source follower 420.

The third slew rate compensation switch P_SW2 may block a current flowing between the power supply voltage VDD and the source follower 420 based on a third switch signal SW3. Also, the third slew rate compensation switch P_SW2 may control the intensity of a current flowing between the power supply voltage VDD and the source follower 420 based on the third switch signal SW3.

The output stage 300 may include first and second output transistors P_O1 and N_O1, and first and second compensation capacitors C1 and C2.

The first output transistor P_O1 has a gate connected to a first node ND1 of the first differential mirror circuit 210 of the load stage 200, a source connected to the power supply voltage VDD, and a drain connected to the output voltage VOUT. A current flowing through the first output transistor P_O1 may vary based on the voltage of the first node ND1 connected to the gate of the first output transistor P_O1.

The second output transistor N_O1 may have a gate connected to the third node ND3 of the second differential mirror circuit 220 of the load stage 200, a source connected to the ground voltage VSS, and a drain connected to the output voltage VOUT. A current flowing through the second output transistor N_O1 may vary based on the voltage of the third node ND3 connected to the gate of the second output transistor N_O1.

When the gate voltages of the first and second output transistors P_O1 and N_O1 increase, the output voltage VOUT of the output stage 300 may decrease. On the other hand, when the gate voltages of the first and second output transistors P_O1 and N_O1 of the output stage 300 decrease, the output voltage VOUT of the output stage 300 may increase.

Specifically, in an example, the first output transistor P_O1 is configured with a PMOS transistor, and when the gate voltage increases, the push current I_Push flowing from the first output transistor P_O1 to the output terminal may decrease. The second output transistor N_O1 is configured with an NMOS transistor, and when the gate voltage increases, the pull current I_Pull flowing from the output terminal to the second output transistor N_O1 may increase. Accordingly, since the push current I_Push provided to the output terminal decreases and the pull current I_Pull provided by the output terminal increases, the output voltage VOUT output from the output terminal rapidly decreases, thereby quickly following the falling transition of the input voltage.

In addition, in another example, the first output transistor P_O1 is configured with a PMOS transistor, and when the gate voltage decreases, the push current I_Push flowing from the first output transistor P_O1 to the output terminal may increase, while the second output transistor N_O1 is configured with an NMOS transistor, and when the gate voltage decreases, the pull current I_Pull flowing from the output terminal to the second output transistor N_O1 may decrease.

Accordingly, since the push current I_Push provided to the output terminal increases and the pull current I_Pull provided by the output terminal decreases, the output voltage VOUT output from the output terminal rapidly increases, thereby quickly following the rising transition of the input voltage.

The first compensation capacitor C1 may have one end connected to the output voltage VOUT and the other end connected to the first differential mirror circuit 210. The second compensation capacitor C2 may have one end connected to the output voltage VOUT and the other end connected to the second differential mirror circuit 220. The slew rate of the output voltage VOUT to the input voltage VIN may increase or decrease based on a charging rate and a discharging rate of the first compensation capacitor C1 and the second compensation capacitor C2.

Hereinafter, a control method of improving a slew rate of the buffer circuit 1000 according to one or more embodiments of the present disclosure will be described.

Figure 7:
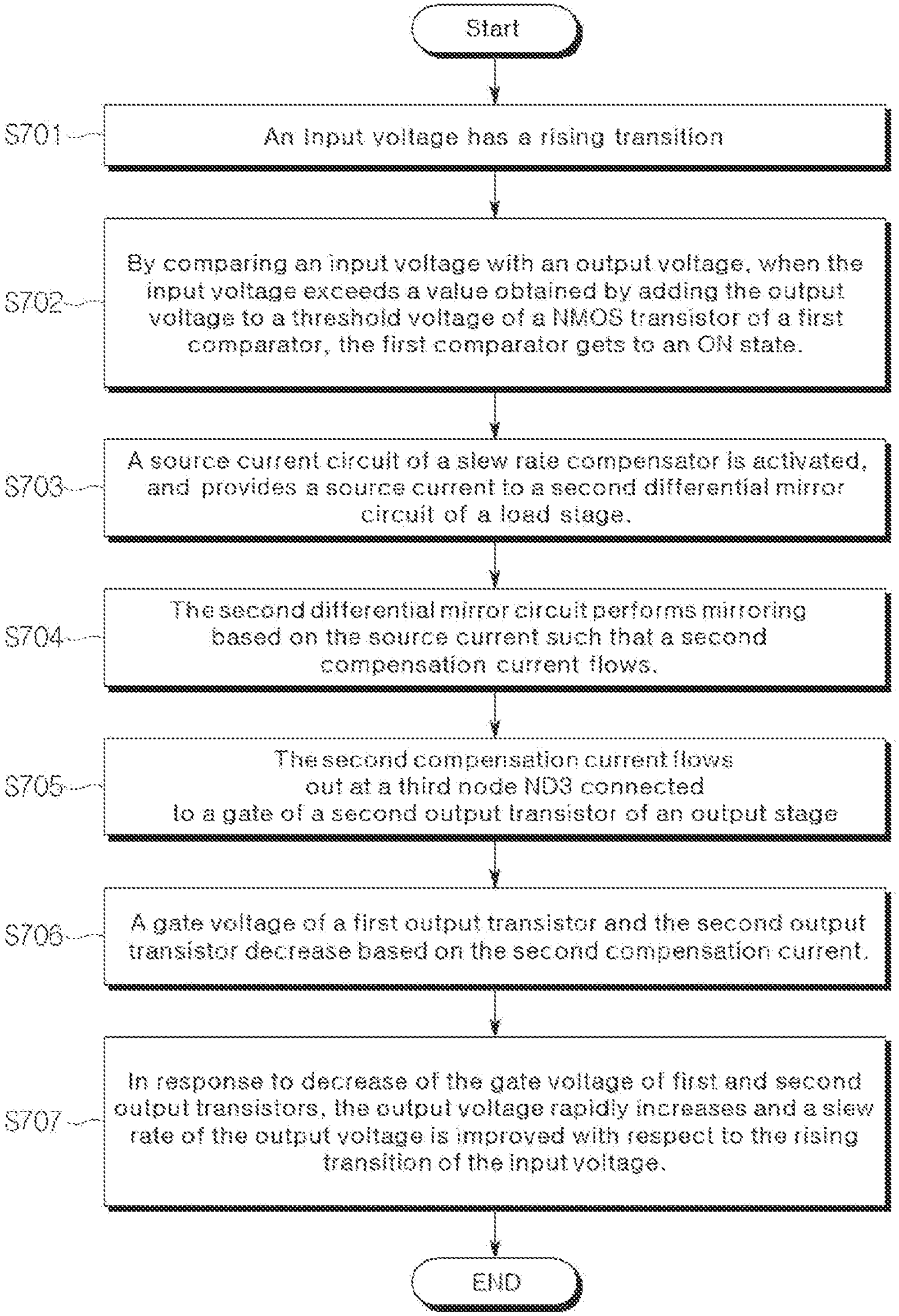
FIG. 7 is a diagram illustrating a method of improving a slew rate of an output voltage with respect to a rising transition of an input voltage according to an embodiment of the present disclosure.
Figure 8:
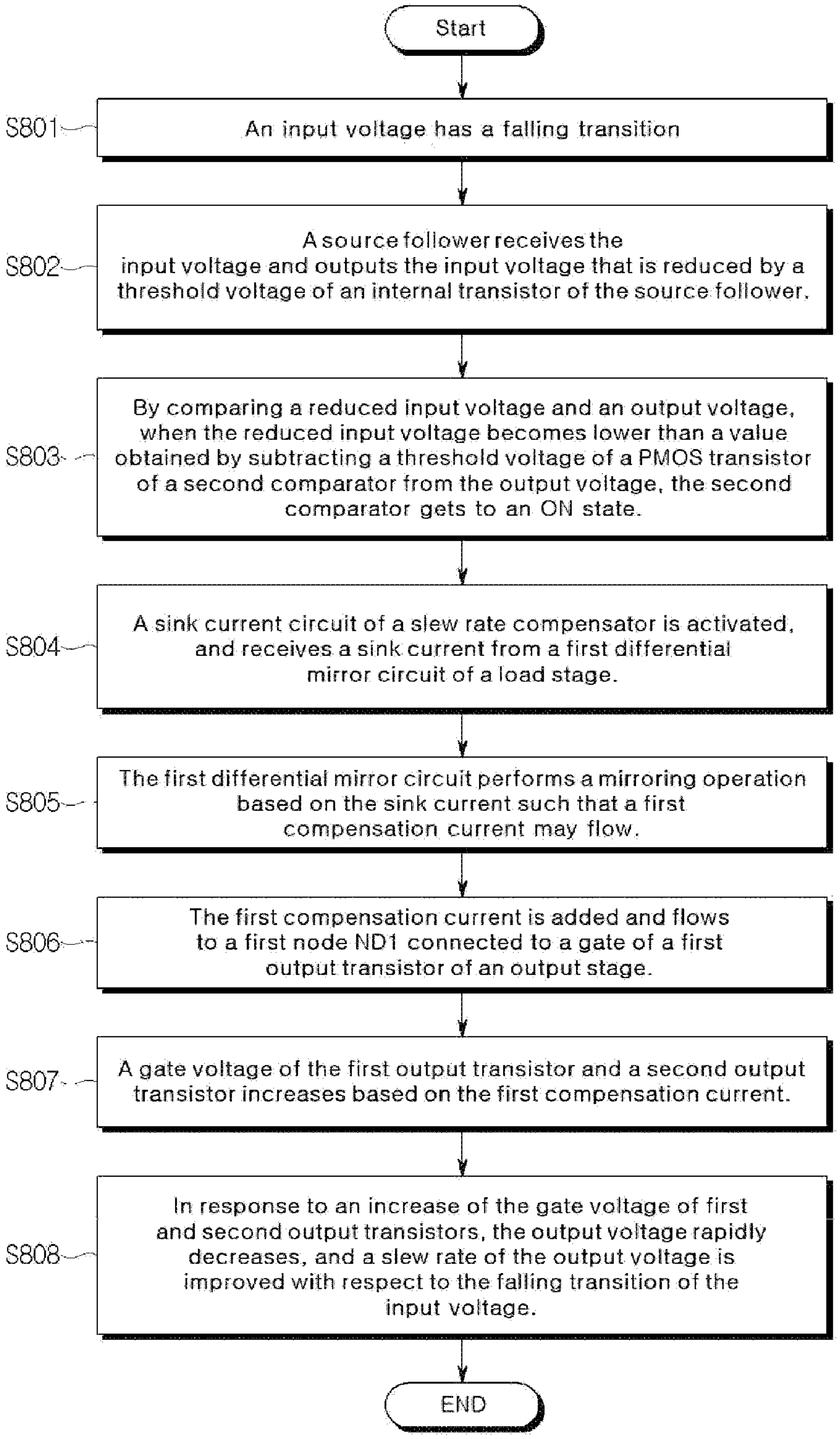
FIG. 8 is a diagram illustrating a method of improving a slew rate of an output voltage with respect to a falling transition of an input voltage according to an embodiment of the present disclosure.

FIG. 7 is a diagram illustrating a method of improving a slew rate of an output voltage with respect to the rising transition of the input voltage according to one or more embodiments of the present disclosure, and FIG. 8 is a diagram illustrating a method of improving the slew rate of the output voltage with respect to the falling transition of the input voltage according to one or more embodiments of the present disclosure.

The slew rate compensation operation, which rapidly increases the output voltage VOUT when the input voltage VIN increases, and the slew rate compensation operation, which rapidly decreases the output voltage VOUT when the input voltage VIN decreases, will be described separately.

First, with reference to FIG. 7, the slew rate compensation operation, which rapidly increases the output voltage VOUT as the input voltage VIN increases, is described.

In steps S701 and S702, when the input voltage has the rising transition, that is, when the input voltage VIN changes to "H(e.g., VDD)" in a state where the input voltage VIN and the output voltage VOUT are both "L(e.g., VSS)", a time point occurs when a magnitude of the input voltage VIN exceeds a value obtained by adding the output voltage to a threshold voltage of the NMOS transistor of a first comparator, the first comparator N_COMP may switch to an ON operating state, and the second comparator P_COMP may switch to an OFF operating state. Accordingly, the source current circuit 430 may be activated and the sink current circuit 440 may be inactivated.

In step S703, when the source current circuit 430 is activated, the first source PMOS transistor P_SR1 of the source current circuit 430 is connected to the first comparator N_COMP to allow the source reference current to flow therein. The second source PMOS transistor P_SR2 of the source current circuit 430 has a current mirror structure based on the first source PMOS transistor P_SR1 and mirrors the source reference current to allow the source current I_SOURCE to flow therein. The source current circuit 430 may provide the source current I_SOURCE to the second differential mirror circuit 220 of the load stage 200.

In step S704, when the second differential mirror circuit 220 receives the source current I_SOURCE at the fourth node ND4 from the slew rate compensator 400, the gate voltage of the first load stage NMOS transistor N_L1 connected to the fourth node ND4 may increase. When the gate voltage of the first load stage NMOS transistor N_L1 increases, the second compensation reference current may flow in a branch to which the first load stage NMOS transistor N_L1 is connected.

When the second compensation reference current flows in the first load stage NMOS transistor N_L1, the second compensation current obtained by mirroring the second compensation reference current may flow in the branch to which the second load stage NMOS transistor N_L2, which has a mirroring structure with the first load stage NMOS transistor N_L1, is connected. Here, the second compensation current may be a current added to the bias current flowing therethrough when the second load stage NMOS transistor N_L2 is in a steady state.

In step S705 and S706, when the second compensation current is added to and flows out of the second load stage NMOS transistor N_L2 at the third node ND3, the voltage of the third node ND3 may decrease more rapidly. In addition, a voltage of the first node ND1 connected to the third node ND3 centered about elements of the fourth bias circuit 240 may also decrease. That is, a gate voltage of the first output transistor P_O1 connected to the first node ND1 and a gate voltage of the second output transistor N_O1 connected to the third node ND3 may decrease more rapidly.

In step S707, when the gate voltages of the first and second output transistors P_O1 and N_O1 decrease, the first output transistor P_O1 is configured with a PMOS transistor and the push current I_Push flowing from the first output transistor P_O1 to the output terminal may increase, while the second output transistor N_O1 is configured with an NMOS transistor and the pull current I_Pull flowing from the output terminal to the second output transistor N_O1 may decrease. Therefore, since the push current I_Push supplied to the output terminal increases and the pull current I_Pull supplied from the output terminal decreases, the output voltage VOUT output from the output terminal increases rapidly, thus quickly following the rising transition of the input voltage.

Next, referring to FIG. 8, a slew rate compensating operation by which the output voltage VOUT rapidly decreases when the input voltage VIN decreases will be described.

First, in steps S801 to S802, when the input voltage VIN has the falling transition, that is, when the input voltage VIN changes to "L(e.g., VSS)" in a state where the input voltage VIN and the output voltage VOUT are "H(e.g., VDD)", the input voltage may be output by the source follower 420 as a value lower than a threshold voltage of the internal MOS transistor of the source follower 420.

In step S803, a time point occurs when a magnitude of the reduced input voltage VIN becomes lower than a value obtained by subtracting the threshold voltage of the PMOS transistor of a second comparator from the output voltage VOUT, and at this time, the first comparator N_COMP may switch to an OFF operating state, and the second comparator P_COMP may switch to an ON operating state. Accordingly, the sink current circuit 440 may be activated and the source current circuit 430 may be inactivated.

In step S804, when the sink current circuit 440 is activated, the first sink NMOS transistor N_SR1 of the sink current circuit 440 is connected to the second comparator P_COMP so that the sink reference current can flow therein. The second sink NMOS transistor N_SR2 of the sink current circuit 440 has a current mirror structure based on the first sink NMOS transistor N_SR1 and mirrors the sink reference current such that the sink current I_SINK may flow therein. The sink current circuit 440 may receive the sink current I_SINK from the first differential mirror circuit 210 of the load stage 200.

In S805, when the first differential mirror circuit 210 provides the sink current I_SINK to the slew rate compensator 400 from the second node ND2, the gate voltage of the first load stage PMOS transistor P_L1 connected to the second node ND2 may decrease. When the gate voltage of the first load stage PMOS transistor P_L1 decreases, the first compensation reference current may flow in a branch to which the first load stage PMOS transistor P_L1 is connected.

When the first compensation reference current flows in the first load stage PMOS transistor P_L1, the first compensation current obtained by mirroring the first compensation reference current may flow in the branch to which the second load stage PMOS transistor P_L2, which has a mirroring structure with the first load stage PMOS transistor P_L1, is connected. Here, the first compensation current may be a current added to the bias current flowing through the second load stage PMOS transistor P_L2 when the second load stage PMOS transistor P_L2 is in a steady state.

In step S806 and S807, when the first compensation current is added and flows from the second load stage PMOS transistor P_L2 to the first node ND1, the voltage at the first node ND1 may increase. In addition, a voltage of a third node ND3 connected to the first node ND1 centering around about elements of the fourth bias circuit 240 may also increase. That is, a gate voltage of the first output transistor P_O1 connected to the first node ND1 and a gate voltage of a second output transistor N_O1 connected to the third node ND3 may increase.

In step S808, when the gate voltages of the first and second output transistors P_O1 and N_O1 increase, the first output transistor P_O1 is configured with a PMOS transistor and a push current I_Push flowing from the first output transistor P_O1 to the output terminal may decrease, and the second output transistor N_O1 is configured with an NMOS transistor and a pull current I_Pull flowing from the output terminal to the second output transistor N_O1 may increase. Accordingly, since the push current I_Push supplied to the output terminal decreases and the pull current I_Pull supplied from the output terminal increases, the output voltage VOUT output from the output terminal decreases rapidly, thereby quickly following the falling transition of the input voltage.

As described above, the buffer circuit according to one or more embodiments of the present disclosure may improve slew rate, alleviate size constraints, and provide a circuit that can be implemented with low power consumption.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A buffer circuit for generating an output voltage according to an input voltage, the buffer circuit comprising:

an input stage configured to provide a first differential current to a load stage or receive a second differential current from the load stage based on a difference between the input voltage and the output voltage;

the load stage configured to apply gate voltages to a first output transistor and a second output transistor of an output stage based on the first differential current or the second differential current;

the output stage configured to regulate the output voltage based on the gate voltages applied to the first output transistor and the second output transistor; and a slew rate compensator configured to provide a source current to the load stage or receive a sink current from the load stage to regulate the gate voltages of the first output transistor and the second output transistor, wherein the slew rate compensator includes a first comparator, a second comparator, and a source follower configured to reduce the input voltage by a threshold voltage of an NMOS transistor included in the source follower and provide the reduced input voltage to a gate terminal of the second comparator.

2. The buffer circuit of claim 1, wherein the slew rate compensator comprises:

the first comparator configured to switch to an ON or OFF state based on the difference between the input voltage and the output voltage;

the second comparator configured to switch to an ON or OFF state based on a difference between the reduced input voltage and the output voltage;

a source current circuit configured to provide the source current to the load stage; and a sink current circuit configured to receive the sink current from the load stage.

3. The buffer circuit of claim 2, wherein the first comparator comprises an NMOS transistor having a gate receiving the input voltage, a drain connected to the source current circuit, a source receiving the output voltage, and a body connected to the source, and wherein the second comparator comprises a PMOS transistor having a source receiving the output voltage, a gate receiving the reduced input voltage output from the source follower, and a drain connected to the sink current circuit.

4. The buffer circuit of claim 2, wherein the NMOS transistor of the source follower has a gate receiving the input voltage, a drain connected to a power supply voltage, a source connected to a gate of a PMOS transistor of the second comparator, and a body connected to the source.

5. The buffer circuit of claim 2, wherein the sink current circuit comprises:

a first sink NMOS transistor connected to the second comparator and configured to allow a sink reference current to flow therein; and a second sink NMOS transistor having a current mirror structure based on the first sink NMOS transistor to mirror the sink reference current and configured to allow the sink current to flow therein.

6. The buffer circuit of claim 5, wherein the first sink NMOS transistor has a gate connected to the second comparator, a drain connected to the gate, and a source connected to a ground voltage, and wherein the second sink NMOS transistor has a gate connected to the gate of the first sink NMOS transistor, a drain connected to a second node of the load stage having a mirror structure with a first node of the load stage connected to a gate terminal of the first output transistor, and a source connected to the ground voltage.

7. The buffer circuit of claim 2, wherein the source current circuit comprises:

a first source PMOS transistor connected to the first comparator and configured to allow a source reference current to flow therein; and a second source PMOS transistor having a current mirror structure based on the first source PMOS transistor to mirror the source reference current and configured to allow the source current to flow therein.

8. The buffer circuit of claim 7, wherein the first source PMOS transistor has a gate connected to the first comparator, a drain connected to the gate, and a source receiving a power supply voltage, and wherein the second source PMOS transistor has a gate connected to the gate of the first source PMOS transistor, a drain connected to a fourth node of the load stage having a mirror structure with a third node of the load stage connected to a gate terminal of the second output transistor, and a source receiving the power supply voltage.

9. The buffer circuit of claim 2, wherein the slew rate compensator further comprises:

a slew rate compensation switch configured to determine whether to operate the source current circuit or the sink current circuit.

10. The buffer circuit of claim 1, wherein the load stage comprises:

a first differential mirror circuit configured to have a current mirror structure and a cascode structure and mirror the second differential current and the sink current;

a second differential mirror circuit configured to have a current mirror structure and a cascode structure and mirror the first differential current and the source current; and a third bias circuit and a fourth bias circuit connected between the first differential mirror circuit and the second differential mirror circuit and configured to control a static state operation and an amplification operation of the first differential mirror circuit and the second differential mirror circuit.

11. The buffer circuit of claim 10, wherein the first differential mirror circuit comprises:

a first load stage PMOS transistor and a second load stage PMOS transistor configured to perform a current mirroring operation; and a third load stage PMOS transistor and a fourth load stage PMOS transistor connected in series with the first load stage PMOS transistor and the second load stage PMOS transistor to form a cascode structure, wherein the first load stage PMOS transistor has a gate connected to the third bias circuit in common with the second load stage PMOS transistor, a drain connected to the third load stage PMOS transistor, and a source connected to a power supply voltage, wherein the second load stage PMOS transistor has a gate connected to the third bias circuit in common with the first load stage PMOS transistor, a drain connected to the fourth load stage PMOS transistor, and a source connected to the power supply voltage, wherein the third load stage PMOS transistor has a gate connected between the first load stage PMOS transistor and the third bias circuit to receive a third bias voltage, a drain connected to the gate of the first load stage PMOS transistor and a second node to provide the sink current to the slew rate compensator, and a source connected to the first load stage PMOS transistor, and wherein the fourth load stage PMOS transistor has a gate connected between the second load stage PMOS transistor and the fourth bias circuit to receive the third bias voltage, a drain connected to a first node which is connected to the fourth bias circuit and a gate terminal of the first output transistor, and a source connected to the second load stage PMOS transistor.

12. The buffer circuit of claim 10, wherein the second differential mirror circuit comprises:

a first load stage NMOS transistor and a second load stage NMOS transistor configured to perform a current mirroring operation; and a third load stage NMOS transistor and a fourth load stage NMOS transistor connected in series with the first load stage NMOS transistor and the second load stage NMOS transistor to form a cascode structure, wherein the first load stage NMOS transistor has a gate connected to the third bias circuit in common with the second load stage NMOS transistor, a drain connected to the third load stage NMOS transistor, and a source connected to a ground voltage, wherein the second load stage NMOS transistor has a gate connected to the third bias circuit in common with the first load stage NMOS transistor, a drain connected to the fourth load stage NMOS transistor, and a source connected to the ground voltage, wherein the third load stage NMOS transistor has a gate connected between the first load stage NMOS transistor and the third bias circuit to receive a fourth bias voltage, a drain connected to the gate of the first load stage NMOS transistor and a fourth node to receive the source current from the slew rate compensator, and a source connected to the first load stage NMOS transistor, and wherein the fourth load stage NMOS transistor has a gate connected between the second load stage NMOS transistor and the fourth bias circuit to receive the fourth bias voltage, a drain connected to a third node which is connected to the fourth bias circuit and a gate terminal of the second output transistor, and a source connected to the second load stage NMOS transistor.

13. The buffer circuit of claim 1, wherein the output stage comprises:

a first compensation capacitor and a second compensation capacitor connected in parallel with an output terminal through which the output voltage is output, and the first output transistor and the second output transistor connected in parallel with the output terminal.

14. A buffer circuit for generating an output voltage according to an input voltage, the buffer circuit comprising:

an input stage configured to provide a first differential current to a load stage or receive a second differential current from the load stage based on a difference between the input voltage and the output voltage;

the load stage configured to apply gate voltages to a first output transistor and a second output transistor of an output stage based on the first differential current or the second differential current;

the output stage configured to regulate the output voltage based on the gate voltages applied to the first output transistor and the second output transistor; and a slew rate compensator configured to provide a source current to the load stage or receive a sink current from the load stage to regulate the gate voltages of the first output transistor and the second output transistor, wherein the slew rate compensator comprises:

a first comparator, a second comparator connected to the first comparator, and a source follower configured to reduce the input voltage by a threshold voltage of a MOS transistor included in the source follower and provide the reduced input voltage to a gate terminal of the second comparator.

15. The buffer circuit of claim 14, wherein the slew rate compensator comprises:

a source current circuit configured to provide the source current to the load stage; and a sink current circuit configured to receive the sink current from the load stage.

16. The buffer circuit of claim 15, wherein the first comparator comprises an NMOS transistor having a gate receiving the input voltage, a drain connected to the source current circuit, a source receiving the output voltage, and a body connected to the source, and wherein the second comparator comprises a PMOS transistor having a gate receiving the reduced input voltage output from the source follower, a drain connected to the sink current circuit, and a source receiving the output voltage.

17. The buffer circuit of claim 16, wherein the source follower comprises an NMOS transistor having a gate receiving the input voltage, a drain connected to a power supply voltage, a source connected to the gate of the PMOS transistor of the second comparator, and a body connected to the source, and wherein the source follower is configured to reduce the input voltage by a threshold voltage of the NMOS transistor and provide the reduced input voltage to the gate of the PMOS transistor of the second comparator.

18. A method of controlling a buffer circuit, the method comprising:

comparing an input voltage and an output voltage of the buffer circuit;

providing a source current to a load stage or receiving a sink current from the load stage by a slew rate compensator based on a difference between the input voltage and the output voltage;

flowing a first compensation current and a second compensation current through a first differential mirror circuit and a second differential mirror circuit of the load stage based on the source current and the sink current;

increasing or decreasing gate voltages of a first output transistor and a second output transistor of an output stage based on the first compensation current and the second compensation current; and allowing the output voltage to follow a rising or falling transition of the input voltage based on an increase or decrease in the gate voltages of the first output transistor and the second output transistor, wherein the comparing of the input voltage and the output voltage further comprises:

comparing the difference between the input voltage and the output voltage when the input voltage is in the rising transition; and reducing the input voltage by a threshold voltage of a MOS transistor included in a source follower, and comparing the reduced input voltage with the output voltage when the input voltage is in the falling transition.

19. The method of claim 18, further comprising:

providing, by the slew rate compensator, the source current to the load stage when the input voltage exceeds a value obtained by adding the output voltage to a threshold voltage of a MOS transistor of a first comparator;

flowing the second compensation current through the second differential mirror circuit based on the source current;

decreasing the gate voltages of the first output transistor and the second output transistor of the output stage based on the second compensation current; and allowing the output voltage to increase and follow the rising transition of the input voltage in response to the decrease in the gate voltages of the first output transistor and the second output transistor.

20. The method of claim 18, further comprising:

providing the input voltage to the source follower when the input voltage is in the falling transition, reducing the input voltage by the threshold voltage of the MOS transistor included in the source follower, and outputting the reduced input voltage;

comparing the reduced input voltage and the output voltage, and receiving the sink current by the slew rate compensator from the load stage when the reduced input voltage becomes lower than a value obtained by subtracting a threshold voltage of a MOS transistor of a second comparator from the output voltage;

flowing the first compensation current through the first differential mirror circuit based on the sink current;

increasing the gate voltages of the first output transistor and the second output transistor of the output stage based on the first compensation current; and allowing the output voltage to decrease and follow the falling transition of the input voltage in response to the increase in the gate voltages of the first output transistor and the second output transistor.

* * * * *